United States Patent [19]
Spicer

[11] Patent Number: 6,097,760
[45] Date of Patent: Aug. 1, 2000

[54] DATA COMMUNICATIONS SYSTEM

[75] Inventor: John Joseph Spicer, Lockerley, United Kingdom

[73] Assignee: Roke Manor Research Limited, Hampshire, United Kingdom

[21] Appl. No.: 08/990,413

[22] Filed: Dec. 15, 1997

[30] Foreign Application Priority Data

Dec. 27, 1996 [GB] United Kingdom .................... 9626944

[51] Int. Cl.⁷ ....................................................... H04B 1/66
[52] U.S. Cl. ............................ 375/241; 375/242; 375/244
[58] Field of Search .................................... 375/242, 244, 375/245, 243, 253, 254, 241

[56] References Cited

U.S. PATENT DOCUMENTS

| | | | |
|---|---|---|---|
| 5,327,461 | 7/1994 | Kushige | 375/244 |
| 5,384,807 | 1/1995 | Yatim et al. | 375/244 |
| 5,559,832 | 9/1996 | Laird | 375/244 |

Primary Examiner—Don N. Vo
Attorney, Agent, or Firm—Evenson, McKeown, Edwards & Lenahan, P.L.L.C.

[57] ABSTRACT

A data communications system includes a standard telecommunications apparatus (1) arranged to transport analogue signals in a form of Adaptive Differential Pulse Code Modulated (ADPCM) digital signals generated from Pulse Code Modulated (PCM) digital signals representative of the analogue signals. A mapping data processor (13) coupled to a source (14) of digital data and to an ADPCM encoder (3) of the standard telecommunications apparatus (1), generates PCM coded symbols representative of the digital data in accordance with a predetermined mapping function. An unmapping data processor (15) connected to an ADPCM to PCM decoder (10) of the apparatus (1) operates to re-generate the digital data from communicated PCM signals. The mapping and unmapping data processes are arranged in combination with the PCM and ADPCM encoding and decoding operations to provide a substantial increase in a rate of data communication, with respect to a data rate which would be achieved if the digital data were to be converted into analogue signals and fed to a PCM encoder of the standard telecommunications equipment.

9 Claims, 4 Drawing Sheets

DATA COMMUNICATIONS SYSTEM

BACKGROUND OF THE INVENTION

The present invention relates to data communications systems, and more particularly to data communications systems which utilise telecommunications apparatus arranged to operate in accordance with a telecommunications standard, wherein analogue signals are communicated in a digital form.

In order to create a telecommunications network from inter-connected items of telecommunications equipment, manufacturers arrange for such items of telecommunications equipment to operate in accordance with a telecommunications standard. Such telecommunications standards are agreed between manufacturers of telecommunications equipment so that equipment may be interchangeable with other manufacturer's equipment, thereby providing a means whereby telecommunications networks may be constructed from equipment supplied from different manufacturers.

It has become well established in the telecommunications art to communicate analogue signals via telecommunications systems, by representing the analogue signals in a digital form. By representing analogue signals in a digital form, a substantial immunity to the effects of noise inevitably introduced by the telecommunications system is provided.

Pulse Code Modulation (PCM) is an example of a known technique for communicating analogue signals in a digital form. Pulse Code Modulated signals are generated by sampling the analogue signals to be communicated, in accordance with a predetermined sampling rate, and digitally representing the amplitude of each sample. Successive temporally displaced signal samples representative of the analogue signals are thereafter transported via the telecommunications system to a receiver. The receiver operates to re-generate the analogue signals from the PCM samples. To further improve capacity of a telecommunications system, in terms of the number of analogue signals which may be communicated with a given bandwidth, a coding technique known as Adaptive Differential Pulse Code Modulation (ADPCM) may be used in order to reduce an amount of data required to represent PCM data samples. Adaptive Differential Pulse Code Modulation has for this reason become a standard media by which analogue signals or speech data are transmitted over telecommunications systems. As such ADPCM has become embodied in telecommunications standards to the effect that a substantial quantity of telecommunications equipment operates to transport speech data in a form of ADPCM.

The field of wireless data communications is no exception. For example the Digital Enhanced Cordless Telecommunications standard (DECT) is a cordless telephone standard developed by the European Telecommunications Standards Institute for short range wireless communications. A wireless telephone system arranged to operate in accordance with the DECT standard communicates analogue voice band signals in a form of ADPCM data.

In a situation where it is required to communicate digital data over a telecommunications system arranged to operate in accordance with a telecommunications standard, a requirement that information to be communicated must be presented to encoders of the system in an analogue form becomes a technical problem. This is because, for example, PCM and ADPCM encoders are arranged to convert analogue data signals into digital signal samples representing the analogue signal. Therefore in order to communicate digital data using such standard telecommunications equipment, the data must be converted into analogue signals before the data can be communicated using the equipment. This has an effect of substantially reducing a rate at which data may be communicated over such a system.

SUMMARY OF THE INVENTION

The technical problem of increasing a rate of data communication over a telecommunications system arranged to operate in accordance with a telecommunications standard is addressed by the present invention.

According to the present invention there is provided a data communications system for communicating digital data between a digital data source and a digital data sink, said data communications system comprising a standard telecommunications apparatus which includes an encoder which operates in accordance with a data rate adaptation process to generate transport digital signals from pre-transport digital signals representative of analogue signals, a data transmissions system for communicating said transport signals, and a decoder which operates in accordance with said data rate adaptation process to substantially re-generate the pre-transport signals from said transport signals communicated by said data transmission system, characterised in that said data communication system further comprises a mapping data processor coupled to said data source and to said encoder which mapping data processor operates to generate coded symbols representative of the data from said data source in accordance with a predetermined mapping function, said coded symbols conforming to said pre-transport symbols and an unmapping data processor connected to said decoder and to said data sink which unmapping data processor operates to substantially re-generate the data from communicated transport signals in accordance with said mapping function, wherein each of said coded symbols represents at least one digit of the data from said data source and said coded symbols are arranged in combination with said data rate adaptation process to substantially increase a rate of data communication over that achieved with the standard telecommunication system alone.

The pre-transport data signals may be Pulse Code Modulated data signals generated by the first encoder, and the coded symbols may be Pulse Code Modulated symbols.

The transport data signals may be Adaptive Differential Pulse Code Modulated signals, and the data rate adaptation process may be a process for converting Pulse Code Modulated signals into Adaptive Differential Pulse Code Modulated signals.

The mapping data processor and unmapping data processor may further comprise data stores wherein the mapping and unmapping processor stores data symbols generated by the mapping data processor and the subsequent data symbol selected by the mapping data processor is generated in dependence upon the data received from the source and the symbols stored in the data store.

The standard telecommunications apparatus may be a Digital Enhanced Cordless Telecommunications standard communications system comprising at least one base station and at least one mobile station, and the data transmission system for communicating said ADPCM data may comprise a DECT radio communications channel between said at least one base station and said at least one mobile station.

In order to take advantage of the economy of scale provided by creating a digital communications links using standard telecommunications equipment, it has heretofore been necessary to generate analogue signals representative of the digital data to be communicated using standard telecommunications equipment. However by providing a mapping data processor which operates to generate PCM symbols which are representative of the data to be communicated, and which PCM symbols are arranged in combination with the ADPCM coding and transmission system to provide a substantially optimal mapping of data onto PCM symbols, a substantial increase in the data rate can be achieved over that which would otherwise be possible using an analogue representation of data signals.

According to an aspect of the present invention there is provided a method of communicating data using a standard telecommunications apparatus, the standard telecommunications apparatus including an encoder which operates in accordance with a data rate adaptation process to generate transport digital signals from pre-transport digital signals representative of analogue signals, a data transmissions system for communicating said transport signals, and a decoder which operates in accordance with said data rate adaptation process to substantially re-generate the pre-transport signals from said transport signals communicated by said data transmission system, said method comprising the steps of mapping the data to be communicated on to coded symbols, which coded symbols conform to said pre-transport data symbols, feeding said coded symbols to said encoder, using said standard telecommunications apparatus to communicate said coded symbols to the decoder, and unmapping the coded symbols to re-generate the data, wherein the steps of mapping and unmapping are effected in accordance with at least one digit of said data being communicated in combination with said data rate adaptation process performed by said encoder and said decoder.

BRIEF DESCRIPTION OF THE DRAWING

One embodiment of the present invention will now be described by way of example only with reference to the accompanying drawings wherein.

DETAILED DESCRIPTION OF THE INVENTION

As will be appreciated by those skilled in the art the present invention finds application with any telecommunications equipment which operates to transport analogue signals in a form of digital data, and in particular where data is represented as Adaptive Differential Pulse Code Modulated data. As an illustrative embodiment of the present invention, transmission of data over a DECT communications link will be considered and to this end FIG. 1 provides an illustration of an arrangement for transmitting data using a DECT communications system.

Figure 1:
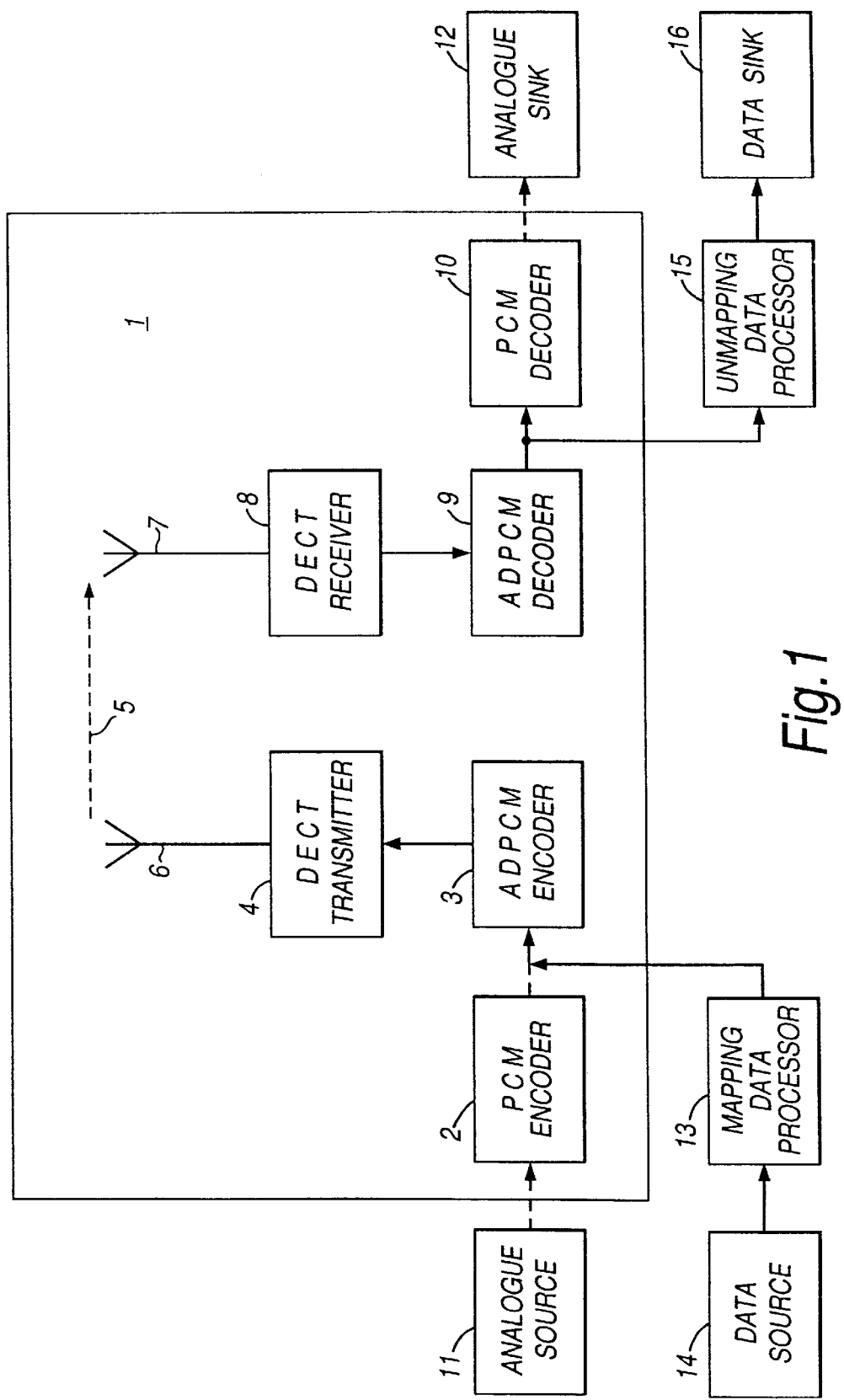
FIG. 1 is a schematic block diagram of a communications system for transmission of digital data using a DECT communications link.

In FIG. 1 schematic elements representative of a DECT communications link are shown within the box 1. The elements within the box 1 illustrate a communications link comprising a PCM encoder 2 which is arranged to feed PCM encoded signal samples to an ADPCM encoder 3. The ADPCM encoder may operate in accordance with a known telecommunications standard such as G.721 in the case of DECT. The ADPCM encoder 3, operates to compress the digital information provided by the PCM encoder, by reducing the number of digits required to represents the PCM signal samples. The ADPCM encoder thereby achieves a reduction in the information bandwidth required to communicate the data from a data source. The data rate of the ADPCM encoder 3, in the DECT communications system is thirty two kilobits per second. ADPCM encoded data is fed to a DECT transmitter 4, which is representative of all parts of the DECT system associated with transmitting data over a radio communications channel represented by the arrow 5 between antennas 6 and 7, to a DECT receiver 8. The DECT receiver 8, is representative of all functional components associated with reception and down conversion of the data transmitted via the radio link 5, and re-generation of the ADPCM data fed to the DECT transmitter 4. The ADPCM data is thereafter fed to a ADPCM decoder 9. The ADPCM decoder 9, operates to convert the ADPCM format data into PCM format data fed to a PCM decoder 10. The PCM decoder 10, re-generates analogue signals generated from an analogue source 11, and feeds these signals to the analogue sink 12.

The DECT system is designed to communicate analogue voice band signals between a mobile unit and a base station unit, with radio signals. As an illustration, therefore, of a known use of a DECT communications link, an analogue source 11, is shown to feed signals to the PCM encoder 2. The analogue source 11, is therefore representative of an analogue voice signal source whereas connected to the PCM decoder is an analogue sink representative of a sink for analogue voice band information such as for example an amplifier and loud speaker arrangement. Therefore in a known arrangement the PCM encoder 2, operates to sample the analogue voice band signal and to generate digital samples corresponding to the samples of the voice band signals. Likewise, the PCM decoder 10, operates to convert the digital signal samples of the analogue voice band data into analogue signals to be fed to the analogue sink 12.

Heretofore transmission of data over a DECT communications system has been achieved by effectively converting the data into analogue signals with characteristics which correspond to those of voice band analogue signals. This situation would therefore be represented by the analogue source 11 shown in FIG. 1. With such an arrangement it has been found that a maximum data rate achievable is in the order of 9.6 kilobits per second, although to ensure an acceptable level of integrity of communicated data, a data rate of 4.8 kilobits per second is preferred. However, bypassing the PCM encoder 2, and PCM decoder 10, and mapping data from the digital data source directly onto PCM signal samples, has an effect of considerably increasing the data rate. To this end, a mapping data processor 13, is coupled to an input of the ADPCM encoder 3 instead of the PCM encoder 2. Digital data from a data source 14, is fed to the mapping data processor 13. The mapping and data processor 13 operates to map the binary data onto the PCM signal samples. The PCM signals are fed to the ADPCM encoder 3, and thereafter the DECT communications system operates as hereinbefore described. However at the receiver ADPCM samples are fed from the decoder 9, to an unmapping data processor 15, which operates to effect a reverse mapping of the mapping performed by the mapping data processor 13.

PCM signal samples generated by the ADPCM decoder 9, are converted into binary data by the unmapping data processor 15 which is thereafter fed to the data sink 16.

Figure 2:
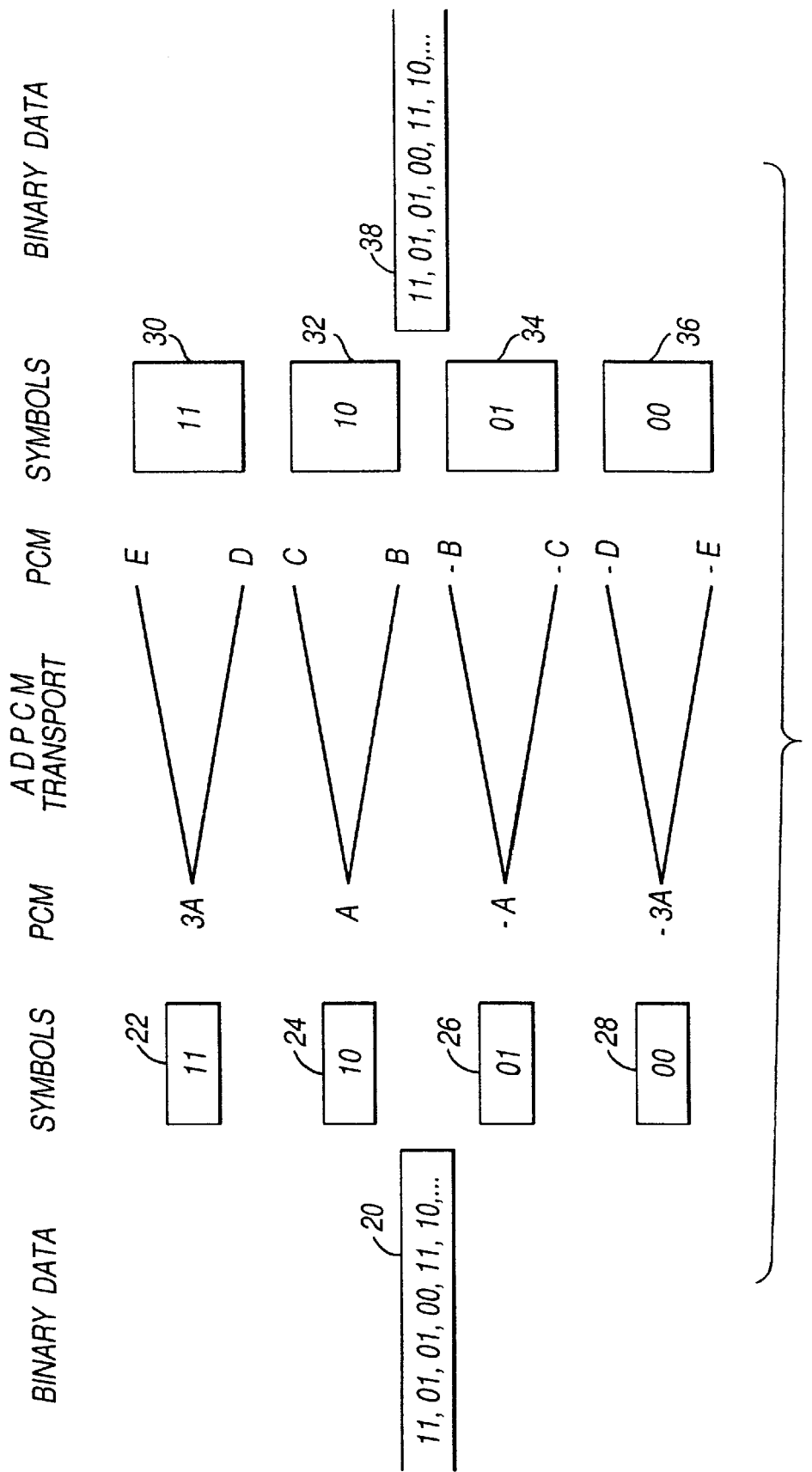
FIG. 2 is an illustrative example of a mapping of binary data onto PCM symbols and FIG. 3 is a further illustrative example of mapping digital data onto PCM symbols.

An example of a possible mapping of the binary data generated by the data source 14, onto PCM signal samples is given in FIG. 2. In FIG. 2, an example of a stream of binary data generated by the data source 14, is shown within the box 20. The binary data is thereafter grouped into pairs of bits which are thereafter mapped onto four PCM signal samples. Within boxes 22, 24, 26, 28, are respectively shown possible combinations of pairs of bits. Juxtapositioned to each of the boxes 22, 24, 26, 28 are alpha numeric character 3A, A, −A, −3A. These alpha numeric characters are representative of PCM signal sample levels wherein A may take any predetermined value. Juxtapositioned to each of the alpha numerical characters 3A, A, −A, −3A are pairs of lines joined at the apex which serve to represent the effect on the PCM signal samples of conversion into ADPCM and communication via the DECT communications link. Each line extending from the apex juxtapositioned to an alpha-numeric character is shown a PCM character E, D, C, B, −B, −C, −D, −E. These PCM signal samples E, D, C, B, −B, −C, −D, −E are representative of possible ranges of signal sample values which would be received at the PCM decoder 10 generated by the ADPCM decoder 9. Between each pair of these PCM signal samples there is shown a further box 30, 32, 34, 36 representative of a pair of bits which correspond to those which appear in the boxes 22, 24, 26, 28. The boxes 30, 32, 34, 36 represent an unmapping from the received PCM signal samples E, D, C, B, −B, −C, −D, −E onto the corresponding pair or binary digits. A box 38 contains corresponding pairs of binary digits reformatted by the unmapping data processor 15 and fed thereafter to the data sink 16.

Figure 3:
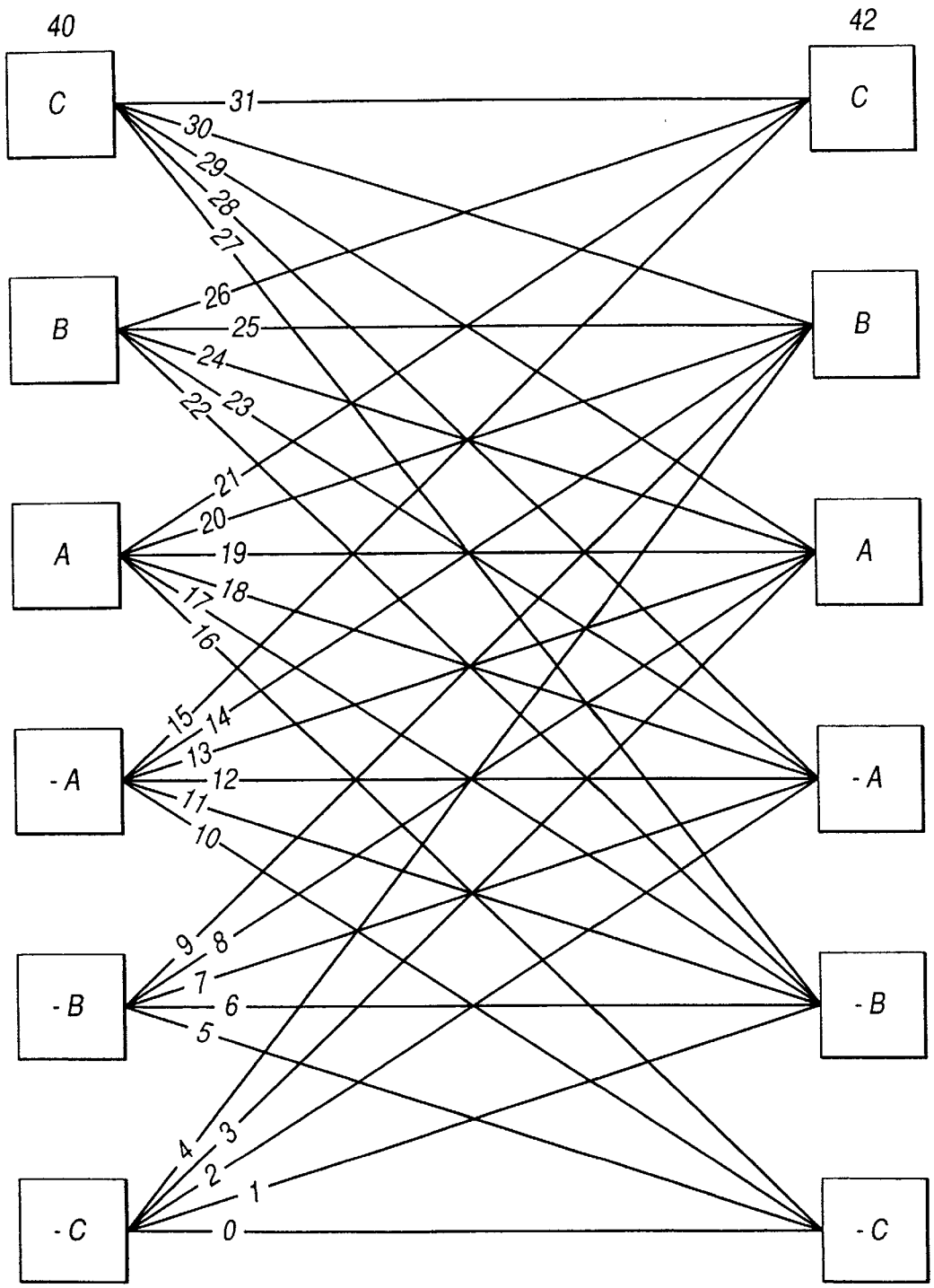

The example mapping illustrated in FIG. 2, provides a possible data rate of up to 16 kilobits per second. However, an even higher data rate using a DECT communications link may be achieved using a data mapping illustrated by the diagram in FIG. 3. In FIG. 3, six PCM signal levels A, B, C, −A, −B, −C are shown in a first column 40 and a second column 42. Connecting each of the PCM signal levels in the first column 40 to each of the PCM signal levels in the second column 42 is a line. On each of the lines there is shown a number in the range between 0 and 31. In this example illustration of a mapping of binary data onto the PCM signal samples, data is represented by a transition in the PCM signal samples between a first PCM signal sample represented by the column 40 and a subsequent signal sample represented by the column 42. In this way it is possible to group the binary data into five bit words and represent the five bit word as a decimal value in the range 0 to 31. Each transition between the PCM signal sample in column 40, to the PCM signal sample in column 42, is associated with one of these decimal values in the range 0 to 31. These values are shown in FIG. 3 next to the lines representing the transitions between signal sample levels. By representing the data as a transition in PCM signal sample levels an increase in the rate of data communication over the DECT communications link is achieved. In order to effect the mapping illustrated in the diagram in FIG. 3, the mapping data processor 13 and unmapping data processor 15 require some memory (not shown in FIG. 1) in order to generate PCM signal samples in accordance with 5 bit words generated from the data source 14.

Figure 4:
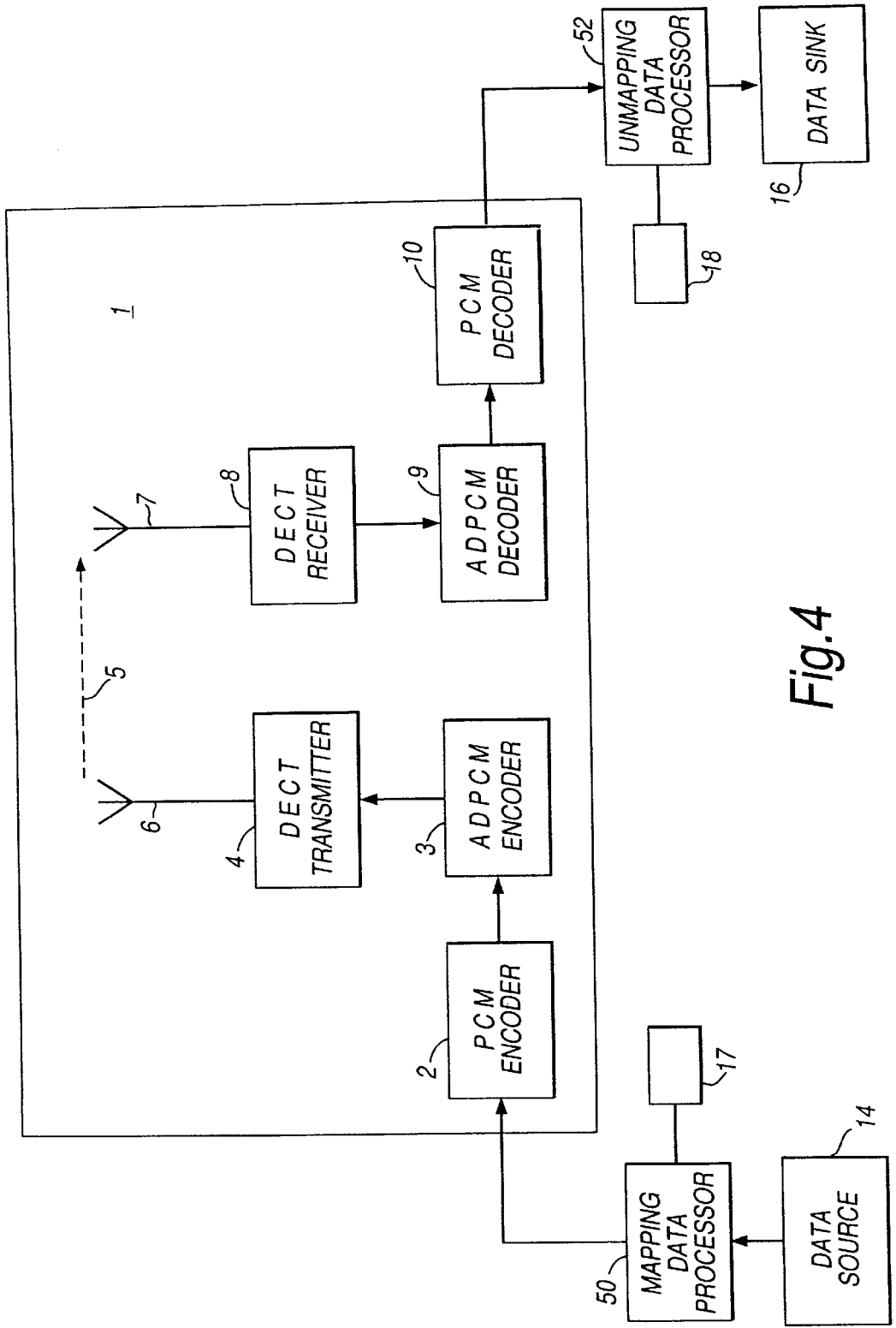
FIG. 4 is a schematic block diagram of a further communications system for transmission of digital data using a DECT communications link.

A further embodiment of the present invention is illustrated in FIG. 4, which shows a DECT communications link also shown in FIG. 1, where parts also appearing in FIG. 1 bear the same numerical designations. Since FIG. 4 also illustrates an embodiment of the present invention with respect to a DECT communications system, the schematic diagram shown in FIG. 4 is very similar to that shown in FIG. 1. For this reason only the differences between FIG. 4 and FIG. 1 will be described. In order to effect a further reuse of apparatus which comprises the DECT communications system shown in FIG. 1, FIG. 4 shows the transmission of data between the data source 14 and data sink 16 using the PCM encoder 2 and PCM decoder 10. In this example embodiment, a mapping data processor 50, operates to map the data from the data source 14, onto analogue signal tones. In an analogous way with the mapping shown in FIG. 2 or 3, the mapping data processor 50, operates to group bits generated from the data source 14, and to map such groups of bits onto analogue signal tones the effect of which is to generate PCM signal samples correspondingly generated at the output of the PCM encoder 2, which are fed to the ADPCM encoder 3. Similarly, the unmapping data processor 52, operates to generate data words from the analogue tones fed from the PCM decoder 10, in correspondence with the output of the ADPCM decoder 9. Thus, the block diagram shown in FIG. 4 operates to recreate the mapping of binary digits onto the PCM signal samples illustrated in for example FIG. 3, but achieves the mapping of data onto PCM signal samples by generating analogue tones from which the PCM encoder 2, generates corresponding PCM signal samples illustrated in FIG. 3. To this end the mapping and unmapping data processors 50, 52 are provided with memory 16, 17.

As will be appreciated by those skilled in the art various mappings of data onto PCM signal samples are possible. Furthermore to obviate non-linear effects in the data transmission process over the DECT communications link, it may be necessary to provide a mapping of data onto PCM signal samples which has an effect of accommodating such non linearities. In particular, where a series of the same PCM signal samples are generated for a substantial period by the mapping data processor, it may be necessary, in order to effect a change in signal level at the PCM decoder, to generate a PCM signal sample which causes a change with a maximum possible dynamic range, by exaggerating the change in signal level, when the period of generating the same PCM signal sample ends.

One application for a DECT system embodying the present invention is for use in a radio in the local loop system wherein the telecommunications link between a domestic premises and a public switch telephone network is effected by a DECT system.

As will be appreciated by those skilled in the art various modifications may be made to the embodiments of the invention hereinbefore described without departing from the scope of the invention. In particular various alternative mapping techniques for mapping the digital data onto PCM signal levels may be envisaged.

I claim:

1. A data communications system for communicating digital data between a digital data source and a digital data sink, said data communications system comprising a standard telecommunications apparatus which includes an encoder which operates in accordance with a data rate adaptation process to generate transport digital signals from pre-transport digital signals representative of analogue signals, a data transmissions system for communicating said transport signals, and a decoder which operates in accordance with said data rate adaptation process to substantially re-generate the pre-transport signals from said transport signals communicated by said data transmission system, characterised in that said data communication system further comprises a mapping data processor coupled to said data source and to said encoder which mapping data processor operates to generate coded symbols representative of the data from said data source in accordance with a predetermined mapping function, said coded symbols conforming to said pre-transport signals and an unmapping data processor connected to said decoder and to said data sink which unmapping data processor operates to substantially re-generate the data from communicated transport signals in accordance with said mapping function, wherein each of said coded symbols represents at least one digit of the data from said data source and said coded symbols are arranged in combination with said data rate adaptation process to substantially increase a rate of data communication over that achieved with the standard telecommunication system alone.

2. A data communications system as claimed in claim 1, wherein the coded symbols generated by the mapping data processor are Pulse Code Modulated symbols.

3. A data communications system as claimed in claim 1, wherein the transport data signals are Adaptive Differential Pulse Code Modulated signals, and the data rate adaptation process is a process for converting Pulse Code Modulated signals into Adaptive Differential Pulse Code Modulated signals.

4. A data communications system as claimed in claim 1, wherein the mapping data processor has a data store in which coded symbols generated by the mapping data processor are stored, and wherein the subsequent coded symbol selected by the mapping data processor is generated in dependence upon the data received from the source and the coded symbols stored in the data store.

5. A data communications system as claimed in claim 1, wherein the unmapping data processor has a data store in which coded symbols generated by the unmapping data processor are stored, and wherein the subsequent coded symbol selected by the unmapping data processor is generated in dependence upon the data received from said decoder and the coded symbols stored in the data store.

6. A data communications system as claimed in claim 1, wherein said standard telecommunications apparatus is a mobile radio telecommunications system comprising at least one base station and at least one mobile station.

7. A data communications system as claimed in claim 1, wherein the mobile radio telecommunications system is a cordless telecommunications system which operates in accordance with the Digital Enhanced Cordless Telecommunications standard, whereby the data transmission system for communicating said ADPCM data is a DECT radio communications channel between said at least one base station and said at least one mobile station.

8. A method of communicating data using a standard telecommunications apparatus, the standard telecommunications apparatus including an encoder which operates in accordance with a data rate adaptation process to generate transport digital signals from pre-transport digital signals representative of analogue signals, a data transmissions system for communicating said transport signals, and a decoder which operates in accordance with said data rate adaptation process to substantially re-generate the pre-transport signals from said transport signals communicated by said data transmission system, said method comprising the steps of mapping the data to be communicated on to coded symbols, which coded symbols conform to said pre-transport data symbols, feeding said coded symbols to said encoder, using said standard telecommunications apparatus to communicate said coded symbols to the decoder, and unmapping the coded symbols to re-generate the data, wherein the steps of mapping and unmapping are effected in accordance with at least one digit of said data being communicated in combination with said data rate adaptation process performed by said encoder and said decoder.

9. A method of communicating data as claimed in claim 8, wherein the step of mapping the data onto the coded symbols further includes the steps of, storing coded data symbols in a data store, and generating said coded symbols from said at least one digit of the data and the stored coded symbols, and the step of unmapping the coded data symbols includes the steps of, storing coded data symbols in a data store, and re-generating the at least one digit of the data from a current coded symbol and the stored coded symbols.

* * * * *